United States Patent
Ho et al.

(10) Patent No.: US 7,483,248 B1
(45) Date of Patent: Jan. 27, 2009

(54) METHOD AND APPARATUS FOR DETECTING CURRENT CHANGES IN INTEGRATED CIRCUITS

(75) Inventors: Ronald Ho, Mountain View, CA (US); Robert J. Drost, Mountain View, CA (US); Arthur R. Zingher, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 561 days.

(21) Appl. No.: 11/134,799

(22) Filed: May 19, 2005

(51) Int. Cl.
| | |
|---|---|
| H02H 3/00 | (2006.01) |
| H02H 3/08 | (2006.01) |
| H02H 9/02 | (2006.01) |
| H02H 1/00 | (2006.01) |
| H02H 1/04 | (2006.01) |
| H02H 3/22 | (2006.01) |
| H02H 9/06 | (2006.01) |
| H01C 7/12 | (2006.01) |
| G01R 15/18 | (2006.01) |

(52) U.S. Cl. ................... 361/87; 361/93.6; 361/118; 361/124; 361/125; 361/126; 324/117; 324/127

(58) Field of Classification Search .......... 361/93.1, 361/93.6, 93.9, 42
See application file for complete search history.

(56) References Cited

U.S. PATENT DOCUMENTS

| | | | | |
|---|---|---|---|---|
| 6,469,538 | B1 * | 10/2002 | Gupta | 324/769 |
| 6,771,058 | B2 * | 8/2004 | Lapinksi et al. | 324/117 R |
| 6,819,538 | B2 * | 11/2004 | Blaauw et al. | 361/90 |
| 7,045,903 | B2 * | 5/2006 | Efland et al. | 257/784 |
| 2002/0186584 | A1 * | 12/2002 | McDowell et al. | 365/171 |
| 2005/0045359 | A1 * | 3/2005 | Doogue et al. | 174/52.1 |

\* cited by examiner

Primary Examiner—Stephen W Jackson
Assistant Examiner—Dharti H Patel
(74) Attorney, Agent, or Firm—Park, Vaughan & Fleming LLP; Shun Yao

(57) ABSTRACT

One embodiment of the present invention provides a system that detects changes in power-supply current within an integrated circuit (IC) chip. During operation, the system monitors an induced current through a detection loop. This detection loop is situated at least partially within the IC chip in close proximity to a power-supply current for the IC chip, so that a change in the power-supply current changes a magnetic field passing through the detection loop, thereby inducing a corresponding current through the detection loop. The system then generates a control signal based on the induced current, so that changes in the power-supply current cause the control signal to change. In addition, the system uses the control signal to control circuits within the IC chip.

19 Claims, 5 Drawing Sheets

METHOD AND APPARATUS FOR DETECTING CURRENT CHANGES IN INTEGRATED CIRCUITS

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

The present invention relates to techniques for detecting current changes in integrated circuits.

Advances in integrated circuit (IC) fabrication technology have greatly increased the density with which circuits can be packed on an IC chip. This has lead to a corresponding increase in the power consumption per unit area on an IC chip. In addition, increasing integration densities have allowed the operation frequency of circuits to continue to rise. As a result, circuits on an IC chip are becoming more sensitive to fluctuations in power-supply voltages. This presents a potential problem because noise in an IC chip's power supply can impair circuit behavior and performance.

Typically, power supply noise reduces the voltage between a circuit's power supply and its ground (see FIG. 1). As its power-supply voltage degrades, a circuit may slow down and become more susceptible to data corruption, because a digital circuit's switching speed generally depends on its power-supply voltage. In synchronous systems, power-supply noise local to one circuit and not to its neighbors can cause timing problems at the interface between the circuits. Moreover, power-supply noise can also cause power-supply voltage to suddenly increase. Such an increase can cause similar problems by speeding up local circuits, which can potentially introduce race-timing errors at circuit interfaces.

Power-supply noise generally arises from sudden changes in the power-supply current. Such changes may result in undesired voltage drop due to the inductance within the power-delivery system. The voltage drop $\Delta V$ can be expressed by: $\Delta V = L \cdot (di/dt)$; where L denotes the inductance, i denotes the instantaneous power-supply current, and t denotes time. In general, one may mitigate the effects of power-supply noise by reducing the power-delivery inductance or by reducing instantaneous changes in current. However, these techniques may not suffice as the complexity and total power consumption of a chip continue to grow. Therefore, it is desirable to detect power-supply noise and to take remedial actions to alleviate the problems caused by power-supply noise.

SUMMARY

One embodiment of the present invention provides a system that detects changes in power-supply current within an integrated circuit (IC) chip. During operation, the system monitors an induced current through a detection loop. This detection loop is situated at least partially within the IC chip in close proximity to a power-supply current for the IC chip, so that a change in the power-supply current changes a magnetic field passing through the detection loop, thereby inducing a corresponding current through the detection loop. The system then generates a control signal based on the induced current, so that changes in the power-supply current cause the control signal to change. In addition, the system uses the control signal to control circuits within the IC chip.

In a variation of this embodiment, generating the control signal involves producing a voltage signal from the induced current and feeding the voltage signal to an edge-detection circuit to generate the control signal.

In a variation of this embodiment, if the induced current is caused by an increase in the power-supply current, using the control signal to control circuits within the IC chip involves using the control signal to temporarily suspend operation of a number of circuits, thereby reducing the power-supply current.

In a further variation, if the induced current is caused by an increase in the power-supply current, using the control signal to control circuits within the IC chip involves gradually resuming operation of the suspended circuits, thereby avoiding a sudden later increase in the power-supply current.

In a variation of this embodiment, if the induced current is caused by a decrease in the power-supply current, the system uses the control signal to temporarily shunt current from a high-voltage power supply to a low-voltage power supply, thereby increasing the power-supply current.

In a variation of this embodiment, the detection loop is situated next to a number of power lines, wherein the power lines are high-voltage power lines or ground lines.

In a variation of this embodiment, the power-supply current flows vertically through a number of metal layers and vias within the IC chip; and the detection loop is situated vertically in the vicinity of the vertically flowing current, so that the detection loop passes through a number of metal layers and vias.

In a variation of this embodiment, the power-supply current flows vertically through a power-supply pad on the IC chip to a through-via connection on a separate substrate which is stacked atop the IC chip. In addition, at least part of the detection loop is situated vertically in the separate substrate, thereby saving metal-layer resources within the IC chip.

In a further variation, the change in the magnetic field to be captured by the detection loop is enhanced by a loop made of magnetic material which passes through the detection loop at least once. In addition, the loop made of magnetic material encloses the power-supply current under detection.

In a further variation, the loop made of magnetic material is a ferromagnetic annular ring embedded within the separate substrate. In addition, the ferromagnetic annular ring encloses a number of power-supply pins associated with a common power-supply voltage

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Power-Supply Noise due to Changes in Power-Supply Current

Figure 1:
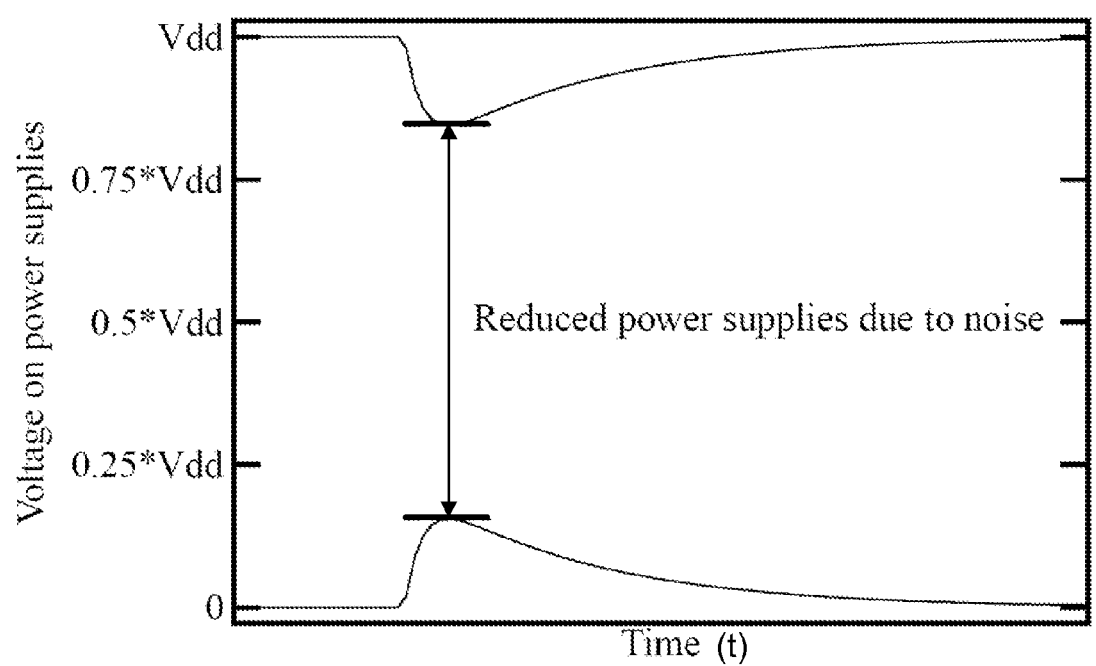
FIG. 1 illustrates an exemplary voltage drop in an IC chip's power-supply due to a sudden change in the power-supply current.

Power-supply noise generally arises from sudden changes in power-supply current, due to the power-delivery system's inductance. The resulting power-supply voltage change may impair circuit behavior and performance. FIG. 1 illustrates an exemplary voltage drop in an IC chip's power-supply due to a sudden change in the power-supply current. As shown in this example, a sudden increase in the power-supply current causes the high-voltage power supply ($V_{dd}$) to drop, and the low-voltage power supply (ground) to rise.

One may use a number of techniques to mitigate the impact of power-supply noise, such as placing decoupling capacitors on the IC chip, on the chip packaging, or on the circuit board; making power-delivery grids on the chip more robust to reduce their inductance; and carefully designing and planning circuits to reduce coordinated switching. These techniques generally reduce the power-supply inductance or instantaneous changes in the power-supply current. However, such techniques may not suffice for increasingly complex chip designs. As both design complexity and total power consumption on a chip continue to increase, it is becoming more difficult to regulate current transients. In addition, power-supply inductance does not scale well, because it depends on large-pitch off-chip structures. Hence, it is desirable to detect power-supply noise to facilitate taking remedial actions in order to ameliorate the associated problems caused by power-supply noise.

One approach to detecting power-supply noise is to sense a change in the power-supply voltage. By detecting the collapse or inflation of power-supply voltages, a control circuit can regulate on-chip behavior to compensate for such changes. Unfortunately, voltage detection may not be sufficiently fast to combat power-supply noise satisfactorily. This is because when a sensor detects a change in the power-supply voltage and generates an appropriate logic control signal (such as "slow down" or "speed up"), the local circuits would have already experienced the power-supply noise and the associated problems. Therefore, it is more advantageous to detect current changes (which precede voltage changes) to gain time for control purposes.

Detection of Changes in Power-Supply Current

Figure 2:
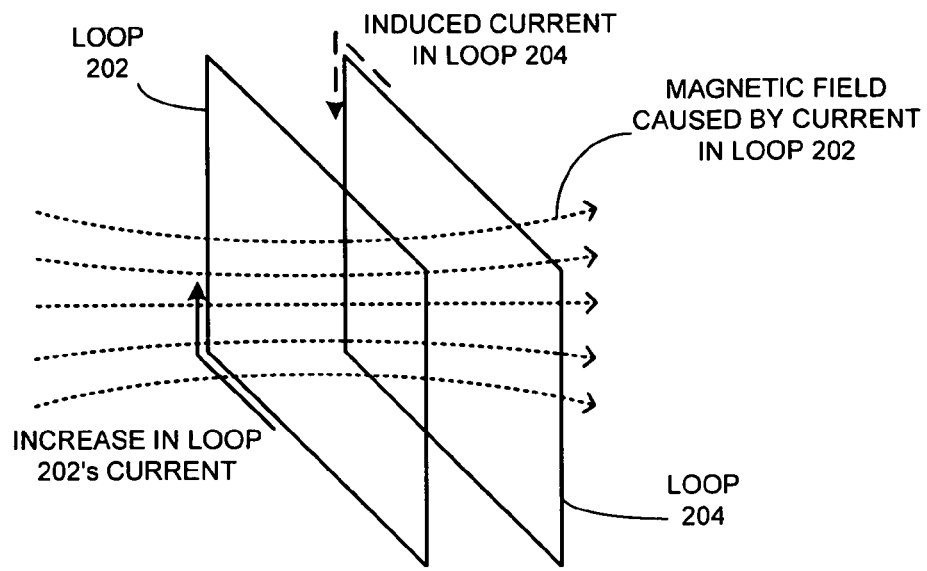
FIG. 2 illustrates an instantaneous current in a second wire loop induced by a current change in a first wire loop.

One embodiment of the present invention is based on the coupling effect between two current loops. FIG. 2 illustrates an instantaneous current in a second wire loop induced by a current change in a first wire loop. In FIG. 2, wire loop 204 is in the vicinity of wire loop 202. Loop 202 carries an active, clockwise current (shown in solid line).

The steady current in loop 202 creates a steady magnetic field, whose direction is from left to right (shown in dotted lines). While the current in loop 202 is steady, the magnetic field is also steady, therefore loop 204 carries no current. When the current in loop 202 increases, the magnetic field increases accordingly, which causes an increase in the magnetic flux through loop 204. As a result, an instantaneous current is induced in loop 204 (shown in broken line). The effect of the induced current 204 is to reduce the increase of magnetic flux. Hence, the induced current flows in the counterclockwise direction, opposite to the direction of loop 202's current.

Note that although FIG. 2 shows an induced current caused by an increasing current in loop 202, a decreasing current in loop 202 can also cause an induced current in loop 204. In this case, the induced current flows in the same direction as loop 202's current.

Figure 3:
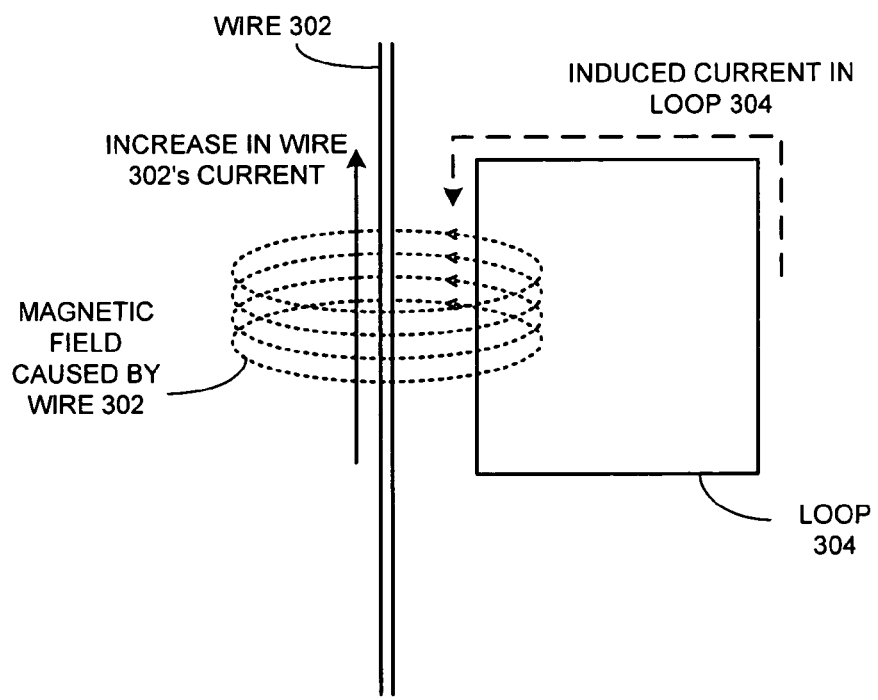
FIG. 3 illustrates an instantaneous current in a loop induced by a current change in a wire located in the proximity of the loop.

One can also observe a similar induced current, as FIG. 3 shows, in a loop near a wire carrying a changing current. FIG. 3 illustrates an instantaneous current in a loop induced by a current change in a wire located in the proximity of the loop. As shown in FIG. 3, a long wire 302 carries an active, upward-flowing current, which creates a circular magnetic field (shown in dotted lines). As the current in wire 302 increases, the magnetic field strengthens accordingly, causing an increase in the magnetic flux in loop 304. Consequently, an instantaneous current is induced in loop 304 which flows counterclockwise to reduce the increase of magnetic flux.

Inductive Current Detection

One embodiment of the present invention employs a di/dt detector which exploits the coupling effect between a current-carrying loop (or wire) and a detection loop. Typically, power-supply current is carried by a number of power-supply wires within an IC chip. The di/dt detector uses a detection loop in the proximity of a power-supply wire to detect a change in the power-supply current.

Figure 4:
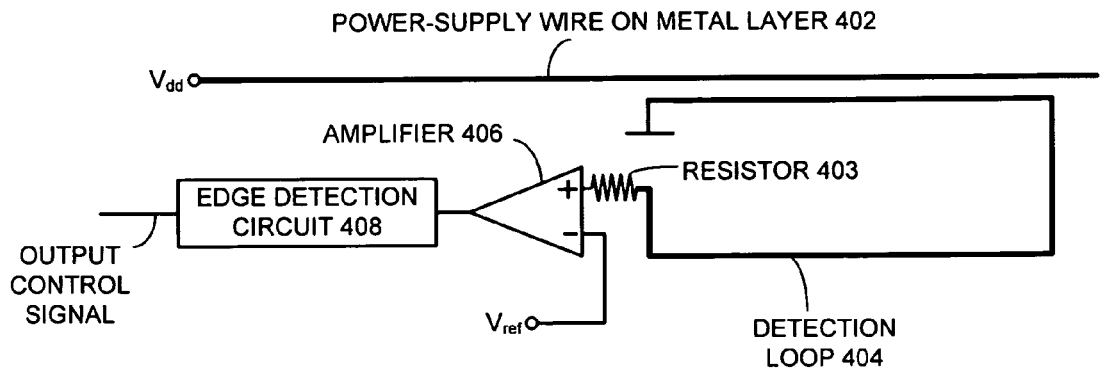
FIG. 4 illustrates an exemplary di/dt detector in proximity to a power-supply wire on an IC chip in accordance with an embodiment of the present invention.

FIG. 4 illustrates an exemplary di/dt detector in proximity to a power-supply wire on an IC chip in accordance with an embodiment of the present invention. As shown in FIG. 4, a detection loop 404 can be fabricated in an on-chip metal layer. Detection loop 404 is situated near a power-supply wire 402 carrying $V_{dd}$. If power-supply wire 402 is sufficiently far from other power-supply wires (and hence there is negligible amount of interference), current changes in power-supply wire 402 can induce a temporary current in detection loop 404. This induced current causes a temporary voltage change over resistor 403 which is subsequently amplified by amplifier 406.

Amplifier 406 compares the temporary voltage change with a reference voltage, $V_{ref}$, and outputs a spike. Because the induced current is not long-lasting, an edge detection circuit 408 (such as a domino gate) can be used to capture the edge produced by amplifier 406. The output of edge detection circuit 408 can serve as a control signal to change on-chip behavior and therefore to mitigate the impact of power-supply voltage fluctuations.

The aforementioned control signal is particularly useful for controlling asynchronous circuits. Unlike classical synchronous circuits, asynchronous circuits can be individually started or stopped at any moment without corrupting its communication with neighboring circuits. This is because an asynchronous circuit typically handshakes with its predecessor and successor circuits. Consequently, if a di/dt detector triggers and asserts a control signal, this signal can be used to suspend certain local asynchronous circuitry for a predefined period of time. The suspension can quickly reduce the current drawn by the suspended local circuits.

However, it may not be desirable to suspend all of the local circuitry with this control signal, because doing so would stop all of the required current. When the circuits resume operation, the di/dt detector might trigger again. Ideally, only a portion of the circuits, preferably ones independent from other circuits, are suspended. In addition, the suspended circuits may resume operation gradually (e.g., in stages), thereby keeping the instantaneous current change to a reasonable level to avoid triggering the di/dt detector.

Although voltage drop is probably the most common form of power-supply noise, a power-supply voltage may also increase temporarily. While not as damaging as a voltage decrease, a voltage increase can still lead to functional errors. Such a voltage increase is typically caused by a decrease in the power-supply current. A di/dt detector as described above can also detect these sudden decreases in power-supply current by, for example, a detection loop biased at ground and an amplifier with a suitable reference voltage. The resulting control signal can be used to shunt current directly from $V_{dd}$ to the ground, thereby increasing the power-supply current back to the steady-state level.

One challenge in detecting small current changes is to increase the sensitivity of the detection loop. Generally, the magnetic flux change caused by a single power-supply wire is small. In addition, power-supply wires that run a long distance on a chip and carry significant amount of current are rare. One way to increase a detection loop's sensitivity level is to place the detection loop near more than one power-supply wire. In this way, the total amount of change in the magnetic flux captured by the detection loop can be increased.

Figure 5:
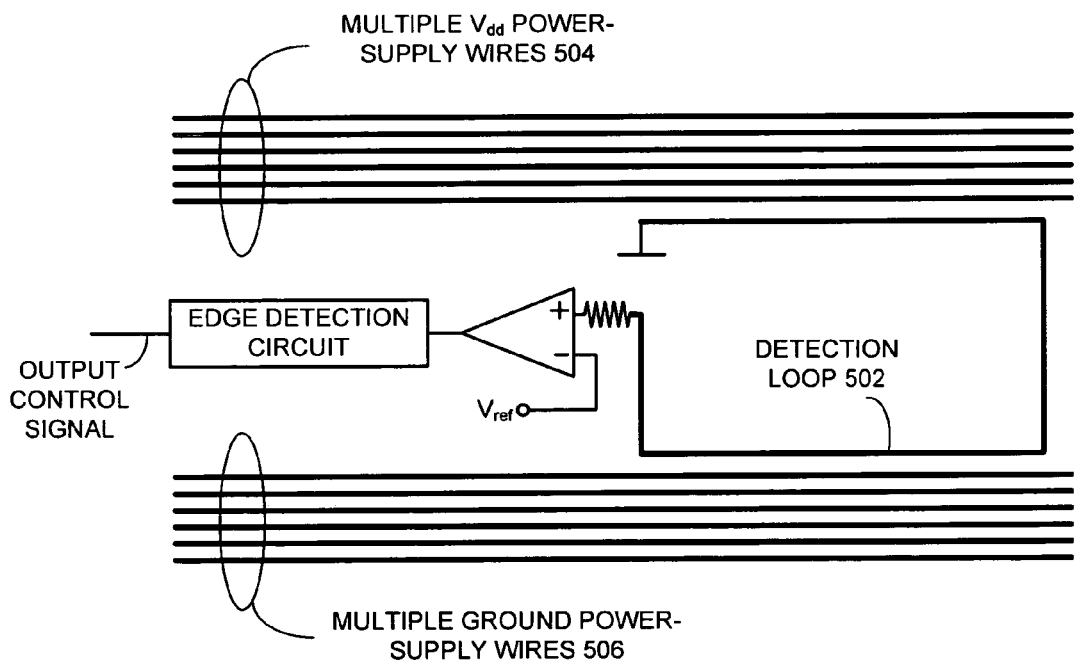
FIG. 5 illustrates an exemplary detection loop between a number of high-voltage power-supply wires and a number of ground wires in accordance with an embodiment of the present invention.

FIG. 5 illustrates an exemplary detection loop between a number of high-voltage power-supply wires and a number of ground wires in accordance with an embodiment of the present invention. In FIG. 5, a detection loop 502 captures the magnetic flux caused by multiple $V_{dd}$ power-supply wires 504 and by multiple ground power-supply wires 506. This configuration allows a number of power-supply wires to jointly induce current in the detection loop. Note that the power-supply wires on one side of the detection loop ideally carry current in the same direction in order to enhance the induced current. Also, the detection loop can be placed near only one group of wires (i.e., only the $V_{dd}$ wires or only the ground wires), instead of being placed between two groups of wires.

On-Chip Vertical Detection Loops

Although detecting current changes horizontally within one metal layer may be a simple approach to implement di/dt detection, it can be difficult to locate a number of long-running power-supply wires within one layer. Fortunately, the power-supply current's flow direction and the detection loop need not to be within a single metal layer. One embodiment of the present invention employs a vertically situated detection loop to detect changes of power-supply current flowing vertically through a number of layers.

Figure 6:
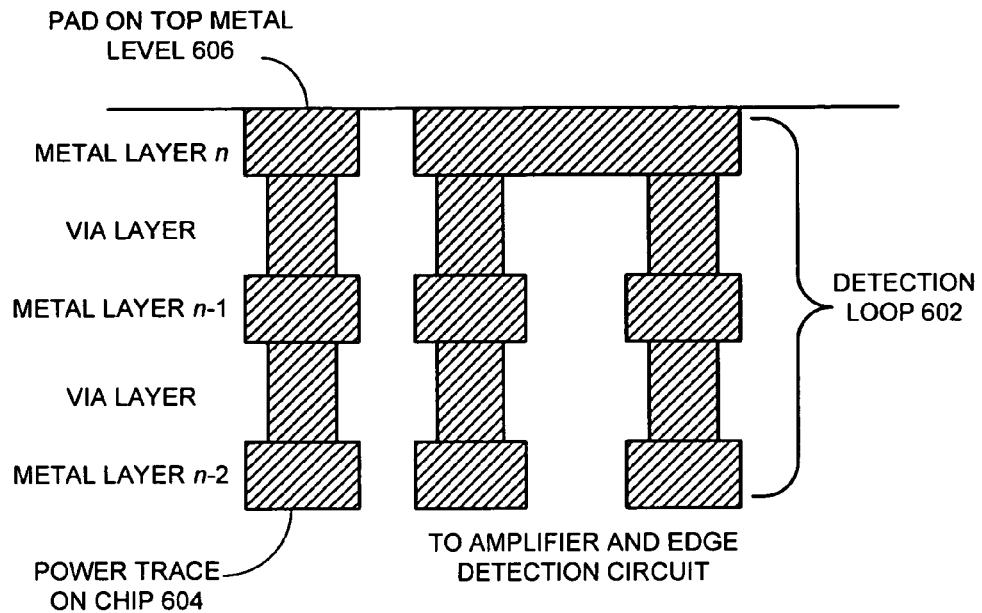
FIG. 6 illustrates an exemplary vertical detection loop across a number of layers in accordance with an embodiment of the present invention.

FIG. 6 illustrates an exemplary vertical detection loop across a number of layers in accordance with an embodiment of the present invention. As shown in FIG. 6, the top n metal layers on the chip are coupled through via layers. A pad on the top metal layer 606 serves as a contact point to an external power source. The metal layers and associated vias form a vertical power trace 604, through which power-supply current flows vertically. A detection loop 602 is placed in the proximity of power trace. Detection loop 602 is constructed through several metal layers and via layers. This vertical configuration helps reduce the usage of metal layers.

Off-Chip Vertical Detection Loops

Although vertical detection loops reduce metal-layer usage, an on-chip loop still occupies some areas on metal layers. To further reduce metal-layer usage, one can alternatively construct a di/dt detector by stacking a separate substrate atop the IC chip, and by placing the detection loop in this separate substrate.

Figure 7:
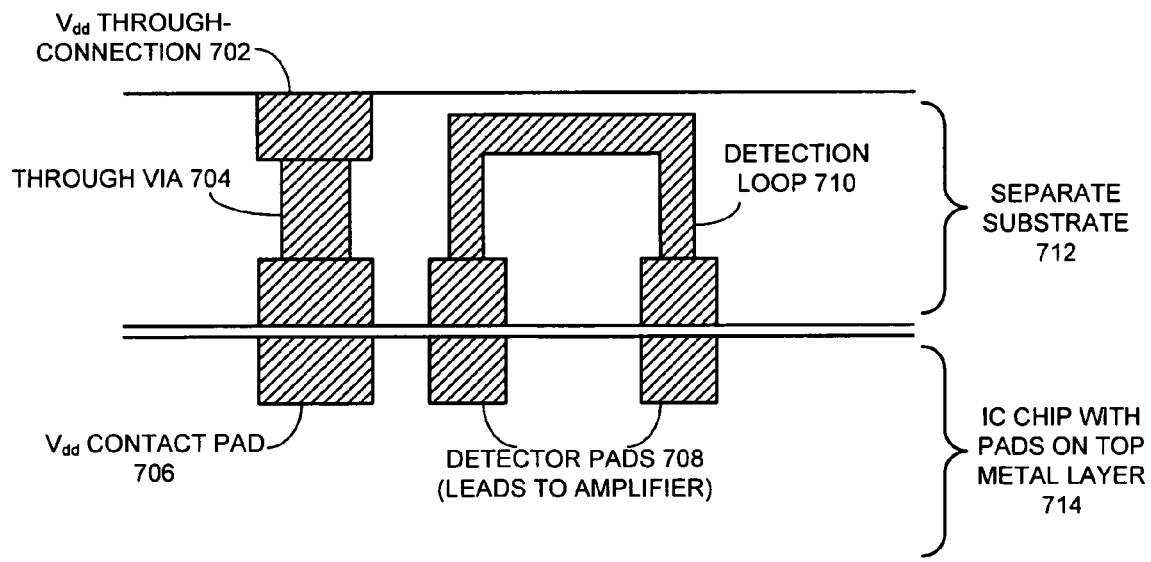
FIG. 7 illustrates an exemplary vertical detection loop situated in a separate substrate in accordance with an embodiment of the present invention.

FIG. 7 illustrates an exemplary vertical detection loop situated in a separate substrate in accordance with an embodiment of the present invention. As shown in FIG. 7, a separate substrate 712 is attached to IC chip 714. The top metal layer on IC chip 714 contains a power-supply contact pad 706 and two detector pads 708. In separate substrate 712, a through via 704 and power contact pads form a power-supply through-via connection 702, through which power-supply current may flow from an external power source to IC chip 714. Also, located within separate substrate 712 is a detection loop 710 which is constructed through metal layers and via layers. At the bottom of detection loop are two contact pads which can be coupled to detector pads 708 on IC chip 714. Hence, the induced current can flow to an amplifier within IC chip 714 through detector pads 708.

Enhancing Detection with Embedded Magnetic Materials

Figure 8:
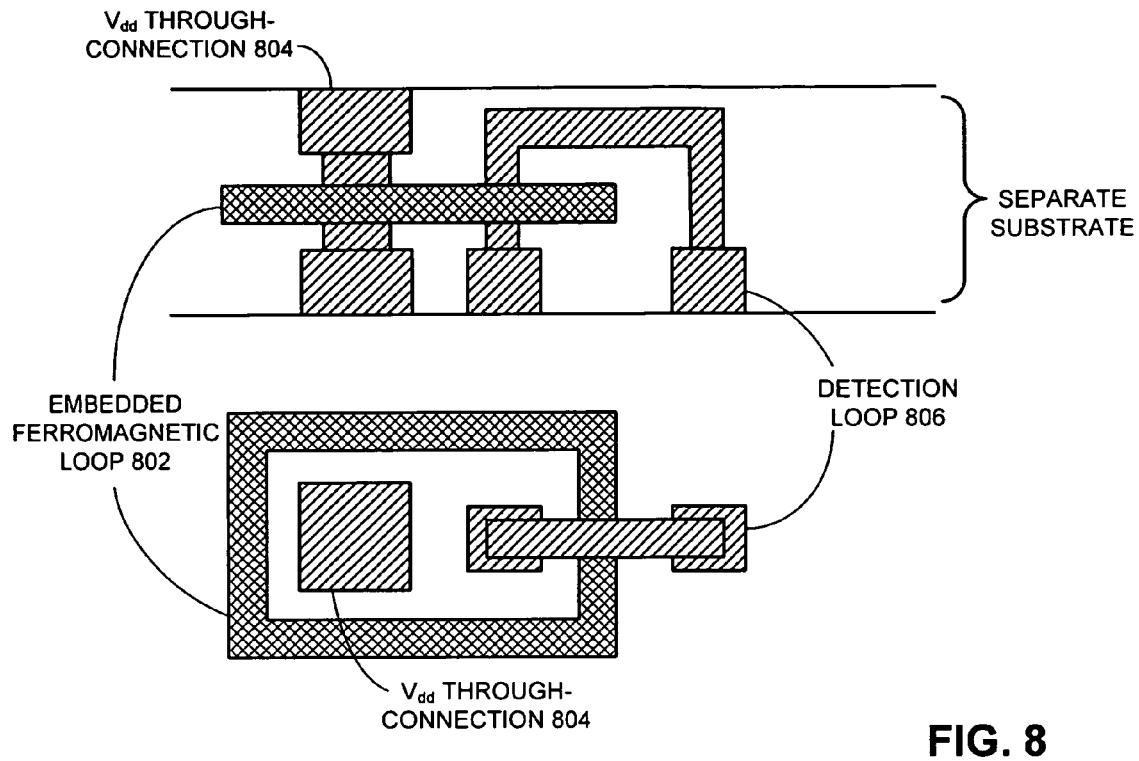
FIG. 8 illustrates an exemplary vertical detection loop whose detection is enhanced by an embedded ferromagnetic loop in accordance with an embodiment of the present invention.

FIG. 8 illustrates an exemplary vertical detection loop whose detection is enhanced by an embedded ferromagnetic loop in accordance with an embodiment of the present invention. A separate substrate laminated to the original chip, as shown in FIG. 8, can enhance the detection loop's detection by including an embedded loop made of magnetic material. Top of FIG. 8 illustrates the cross-section view of this configuration, and bottom of FIG. 8 illustrates the top view.

In this exemplary configuration, an embedded ferromagnetic loop 802 encloses both a power-supply through-connection 804 and a detection loop 806. As a result, more magnetic flux is captured by detection loop 806, and changes in the magnetic flux can be intensified. Note that loop 802 can be embedded in an annular ring with a process used for manufacturing ferromagnetic memories (MRAMs).

In many IC chips, power and ground pins on the top metal layer are often arranged in a checkerboard fashion. One can take advantage of this arrangement and route a ferromagnetic annular ring around a number of power pins of the same polarity, thereby further enhancing the inductive detection.

Figure 9:
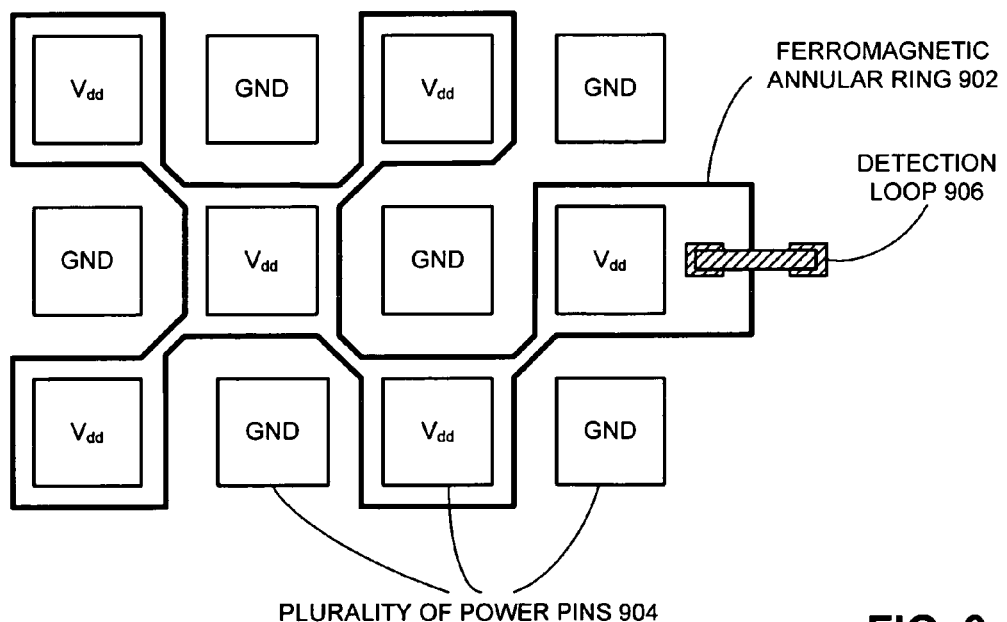
FIG. 9 illustrates a ferromagnetic annular ring enclosing a number of power pads in accordance with an embodiment of the present invention.

FIG. 9 illustrates a ferromagnetic annular ring enclosing a number of power pads in accordance with an embodiment of the present invention. In this example, a plurality of power pins 904 (six $V_{dd}$ pins and six ground pins) are arranged in a 3×4 checkerboard configuration. Ferromagnetic annular ring 902 is routed so that it encloses the six $V_{dd}$ pins and a detection loop 906. Consequently, the effectiveness of the inductive detection can be enhanced significantly.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclo-

What is claimed is:

1. A method for detecting changes in a power-supply current within an integrated circuit (IC) chip, comprising:
   monitoring an induced current through a detection loop, wherein the induced current is induced when a change in the power supply current changes a magnetic field passing through the detection loop;
   using a circuit coupled to the detection loop to generate a control signal based on the induced current, so that changes in the power-supply current cause the control signal to change; and
   using the control signal to control circuits within the IC chip;
   wherein the power supply current flows vertically through a power supply pad on the IC chip to a through via connection on a separate substrate which is stacked atop the IC chip; and
   wherein the detection loop is situated within the separate substrate and in close proximity to the power-supply current.

2. The method of claim 1, wherein generating the control signal involves:
   producing a voltage signal from the induced current; and
   feeding the voltage signal to an edge-detection circuit to generate the control signal.

3. The method of claim 1, wherein if the induced current is caused by an increase in the power-supply current, the control signal is used to temporarily suspend operation of a number of circuits, thereby reducing the power-supply current.

4. The method of claim 3, wherein if the induced current is caused by an increase in the power-supply current, the control signal is used to gradually resume operation of the suspended circuits, thereby avoiding a sudden later increase in the power-supply current.

5. The method of claim 1, wherein if the induced current is caused by a decrease in the power-supply current, the method further comprises using the control signal to temporarily shunt current from a high-voltage power supply to a low-voltage power supply, thereby increasing the power-supply current.

6. The method of claim 1, wherein the detection loop is situated next to a number of power lines; and
   wherein the power lines are high-voltage power lines or ground lines.

7. The method of claim 1, wherein the power-supply current flows vertically through a number of metal layers and vias within the IC chip; and
   wherein the detection loop is situated vertically in the vicinity of the vertically flowing current, so that the detection loop passes through a number of metal layers and vias.

8. The method of claim 1,
   wherein the change in the magnetic field to be captured by the detection loop is enhanced by a loop made of magnetic material which passes through the detection loop at least once; and
   wherein the loop made of magnetic material encloses the power-supply current under detection.

9. The method of claim 8,
   wherein the loop made of magnetic material is a ferromagnetic annular ring embedded within the separate substrate; and
   wherein the ferromagnetic annular ring encloses a number of power-supply pins associated with a common power-supply voltage.

10. An apparatus for detecting changes in a power-supply current within an integrated circuit (IC) chip, comprising:
    a detection loop which monitors an induced current, wherein the induced current is induced when a change in the power-supply current changes a magnetic field passing through the detection loop, wherein the power supply current flows vertically through a power supply pad on the IC chip to a through via connection on a separate substrate which is stacked atop the IC chip, and wherein the detection loop is situated within the separate substrate and in close proximity to the power-supply current;
    a signal generation mechanism, coupled to the detection loop, which generates a control signal based on the induced current, so that changes in the power-supply current cause the control signal to change; and
    a control mechanism which uses the control signal to control circuits within the IC chip.

11. The apparatus of claim 10, wherein while generating the control signal, the control mechanism is configured to:
    produce a voltage signal from the induced current; and
    to feed the voltage signal to an edge-detection circuit to generate the control signal.

12. The apparatus of claim 10, wherein if the induced current is caused by an increase in the power-supply current, the control mechanism is configured to use the control signal to temporarily suspend operation of a number of circuits, thereby reducing the power-supply current.

13. The apparatus of claim 12, wherein if the induced current is caused by an increase in the power-supply current, the control mechanism is configured to gradually resume operation of the suspended circuits, thereby avoiding a sudden later increase in the power-supply current.

14. The apparatus of claim 10, wherein if the induced current is caused by a decrease in the power-supply current, the control mechanism is configured to use the control signal to temporarily shunt current from a high-voltage power supply to a low-voltage power supply, thereby increasing the power-supply current.

15. The apparatus of claim 10, wherein the detection loop is situated next to a number of power lines; and
    wherein the power lines are high-voltage power lines or ground lines.

16. The apparatus of claim 10, wherein the power-supply current flows vertically through a number of metal layers and vias within the IC chip; and
    wherein the detection loop is situated vertically in the vicinity of the vertically flowing current, so that the detection loop passes through a number of metal layers and vias.

17. The apparatus of claim 10, further comprising a loop made of magnetic material, which
    enhances the change in the magnetic field to be captured by the detection loop;
    passes through the detection loop at least once; and
    which encloses the power-supply current under detection.

18. The apparatus of claim 17,
    wherein the loop made of magnetic material is a ferromagnetic annular ring embedded within the separate substrate; and
    wherein the ferromagnetic annular ring encloses a number of power-supply pins associated with a common power-supply voltage.

19. A computer system that contains a circuit for detecting changes in a power-supply current within an integrated circuit (IC) chip, comprising:

a central processing unit (CPU);

a memory;

a detection loop which monitors an induced current, wherein the induced current is induced when a change in the power-supply current changes a magnetic field passing through the detection loop, wherein the power supply current flows vertically through a power supply pad on the IC chip to a through via connection on a separate substrate which is stacked atop the IC chip, and wherein the detection loop is situated within the separate substrate and in close proximity to the power-supply current;

a signal generation mechanism, coupled to the detection loop, which generates a control signal based on the induced current, so that changes in the power-supply current cause the control signal to change; and a control mechanism which uses the control signal to control circuits within the IC chip.

* * * * *